(12) United States Patent  
Fukuda

(10) Patent No.: US 7,420,853 B2
(45) Date of Patent: Sep. 2, 2008

(54) SEMICONDUCTOR STORAGE DEVICE AND SEMICONDUCTOR STORAGE DEVICE DRIVING METHOD

(75) Inventor: Koichi Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/836,907

(22) Filed: Aug. 10, 2007

(65) Prior Publication Data

US 2007/0280005 A1  Dec. 6, 2007

Related U.S. Application Data

(63) Continuation of application No. 11/368,484, filed on Mar. 7, 2006, now Pat. No. 7,269,074.

(30) Foreign Application Priority Data

Mar. 9, 2005  (JP) .............................. 2005-065949

(51) Int. Cl.
*G11C 11/34* (2006.01)
(52) U.S. Cl. ............................ 365/185.29; 365/185.27; 365/185.3
(58) Field of Classification Search ............ 365/185.26, 365/185.3, 185.29
See application file for complete search history.

(56) References Cited

U.S. PATENT DOCUMENTS

| 5,706,241 A | 1/1998 | Nakamura et al. |
| 6,002,354 A | 12/1999 | Itoh et al. |
| 6,061,289 A | 5/2000 | Itoh et al. |
| 2006/0134845 A1 * | 6/2006 | Pham et al. ................. 438/200 |

FOREIGN PATENT DOCUMENTS

| JP | 8-255493 | 10/1996 |
| JP | 11-122109 | 4/1999 |

* cited by examiner

*Primary Examiner*—Huan Hoang
*Assistant Examiner*—Jason Lappas
(74) *Attorney, Agent, or Firm*—Oblon, Spivak, McClelland, Maier & Neustadt, P.C.

(57) ABSTRACT

A semiconductor storage device comprises a semiconductor layer; a plurality of memory cells formed on the semiconductor layer, data writing, erasing or reading with respect to each of the memory cells being possible based on a voltage applied to a control electrode and a voltage applied to the semiconductor layer; a first booster circuit supplying a voltage to control electrodes of selected memory cells into which data is to be written; and a second booster circuit supplying a voltage to control electrodes of inhibited memory cells into which data is not to be written, wherein when erasing data in the memory cells, a potential at the semiconductor layer is boosted in a first boosting mode in which a boosting capability of the first booster circuit is low and a boosting capability of the second booster circuit is high, and then the potential at the semiconductor layer is boosted in a second boosting mode in which the boosting capability of the second booster circuit is low and the boosting capability of the first booster circuit is high.

18 Claims, 5 Drawing Sheets

SEMICONDUCTOR STORAGE DEVICE AND SEMICONDUCTOR STORAGE DEVICE DRIVING METHOD

CROSS-REFERENCE TO RELATED APPLICATIONS

This application is a continuation of and claims the benefit of priority under 35 U.S.C. §120 from U.S. patent application Ser. No. 11/368,484, filed Mar. 7, 2006, the entire contents of which is incorporated herein by reference. This application also claims the benefit of priority under 35 U.S.C. §119 from the prior Japanese Patent Application No. 2005-65949, filed on Mar. 9, 2005, the entire contents of which is incorporated herein by reference.

BACKGROUND OF THE INVENTION

1. Field of the Invention

The present invention relates to a semiconductor storage device and a semiconductor storage device driving method.

2. Related Art

Nonvolatile semiconductor storage devices such as NAND flash memories are frequently used in portable devices such as digital cameras and cellular phones. Such a semiconductor storage device is required to be low in power dissipation, low in current dissipation, and fast in operation.

Such a semiconductor storage device includes a memory cell array formed on a well in a semiconductor substrate. The memory cell array is divided into a large number of blocks, and each block includes a plurality of memory cells. One well is formed so as to extend over a plurality of blocks. Typically, one well is provided so as to extend over the entire memory cell, When erasing data in memory cells included in one block, therefore, it is necessary to charge a large-capacity well provided over a plurality of blocks. Hereafter, a well potential needed to erase data in memory cells is referred to as erasing potential.

The well is boosted by using booster circuits of a plurality of kinds sometimes, For example, the well is boosted by booster circuits of two kinds: a booster circuit BCpgm and a booster circuit BCpass. The booster circuit BCpgm supplies a write voltage to memory cells into which data is to be written, i.e., selected cells The booster circuit BCpass supplies a write inhibition voltage to memory cells into which data is not to be written, i.e., inhibited memory cells. The booster circuit BCpgm has more booster stages than the booster circuit BCpass. As a result, the booster circuit BCpgm can conduct boosting to a higher potential than the booster circuit BCpass. On the other hand, the booster circuit BCpass is less in power dissipation than the booster circuit BCpgm.

In order to boost the well to an erasing potential at the time of data erasing, either a method using only the booster circuit BCpgm (method 1) or a method using both the booster circuits BCpgm and BCpass (method 2) is conventionally used.

In the method it takes a considerably long time to boost the large-capacity well to the erasing potential. Therefore, it is difficult for the method 1 to meet the demand of fast operation of semiconductor storage devices which will become more intensive hereafter. In the method 2 boosting is conducted by using both booster circuits BCpgm and BCpass, and then boosting is conducted by using only the booster circuit BCpgm. In the method 2 therefore, the well can be boosted in a short time. In the method 2, however, both the booster circuits BCpgm and BCpass are used, resulting in a problem that the instantaneous peak of the current dissipation becomes too large.

In both the method 1 and the method 2, the booster circuit BCpgm is mainly used to boost the well. Since the booster circuit BCpgm has more booster stages than BCpass, the booster circuit BCpgm is poor in boosting efficiency. Therefore, these methods also have a problem that considerably much power is dissipated to boost the well Therefore, a semiconductor storage device and a semiconductor storage device driving method that are low in power dissipation, low in current dissipation, and fast in operation speed are provided.

SUMMARY OF THE INVENTION

A semiconductor storage device according to an embodiment of the present invention comprises a semiconductor layer; a plurality of memory cells formed on the semiconductor layer, data writing, erasing or reading with respect to each of the memory cells being possible based on a voltage applied to a control electrode and a voltage applied to the semiconductor layer; a first booster circuit supplying a voltage to control electrodes of selected memory cells into which data is to be written; and a second booster circuit supplying a voltage to control electrodes of inhibited memory cells into which data is not to be written, wherein when erasing data in the memory cells, a potential at the semiconductor layer is boosted in a first boosting mode in which a boosting capability of the first booster circuit is low and a boosting capability of the second booster circuit is high, and then the potential at the semiconductor layer is boosted in a second boosting mode in which the boosting capability of the second booster circuit is low and the boosting capability of the first booster circuit is high.

A driving method for a semiconductor storage device according to an embodiment of the present invention, wherein the semiconductor storage device includes a semiconductor layer; a plurality of memory cells formed in the semiconductor layer, data writing, erasing or reading with respect to each of the memory cells being possible based on a voltage applied to a control electrode and a voltage applied to the semiconductor layer; a first booster circuit supplying a voltage to control electrodes of selected memory cells into which data is to be written; and a second booster circuit supplying a voltage to control electrodes of inhibited memory cells into which data is not to be written, when erasing data in the memory cells, the driving method comprises boosting a potential at the semiconductor layer in a first boosting mode in which a boosting capability of the first booster circuit is low and a boosting capability of the second booster circuit is high; and boosting the potential at the semiconductor layer in a second boosting mode in which the boosting capability of the second booster circuit is low and the boosting capability of the first booster circuit is high.

DETAILED DESCRIPTION OF THE INVENTION

Figure 1:
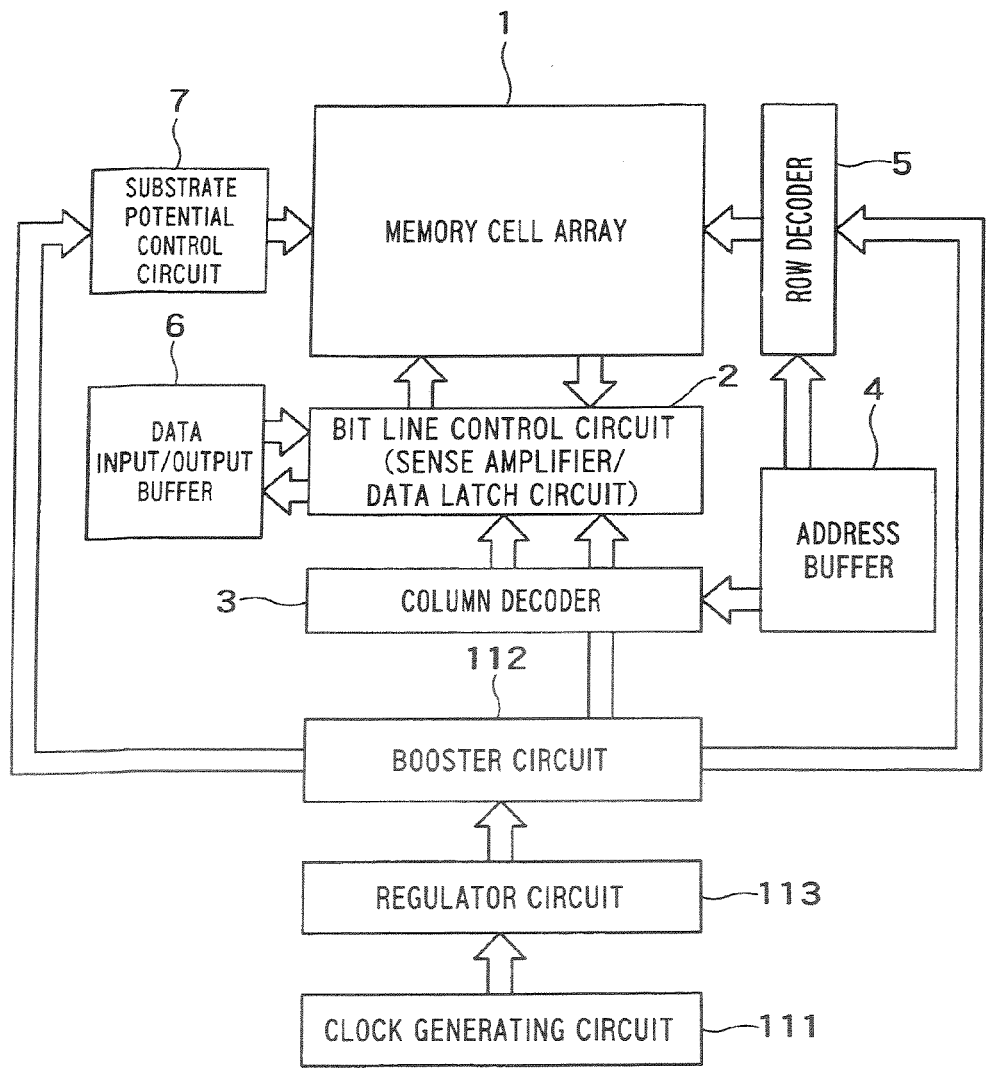
FIG. 1 is a block diagram of a semiconductor storage device 10 according to the embodiment of the present invention.

Hereafter, an embodiment according to the present invention will be described with reference to the drawings. The present embodiment does not restrict the present invention, FIG. 1 is a block diagram of a semiconductor storage device 10 according to the embodiment of the present invention The semiconductor storage device 10 is a NAND type EEPROM, a NAND type flash memory, or the like. The semiconductor storage device 10 includes a memory cell array 1, a bit line control circuit 2, a column decoder 3, an address buffer 4, a row decoder 5, a data input-output buffer 6, a substrate potential control circuit 7, a clock generator circuit 111, a booster unit 112, and a regulator circuit 113

The memory cell array 1 includes a large number of blocks each having a plurality of memory cells. For example, the memory cell array 1 is divided into 1,024 or 2,048 blocks.

The memory cell array 1 is formed on one semiconductor layer. The semiconductor layer may be, for example, a p-type or n-type well diffusion layer formed in a surface region of a semiconductor substrate. Hereafter, the semiconductor layer is referred to as well as "well".

Each memory cell has a control gate. Data writing, erasing or reading can be conducted on the basis of a voltage applied to the control electrode and a voltage applied to the well. As for erasing data in memory cells, it is necessary to boost the well extending over a plurality of blocks to an erasing potential.

The bit line control circuit 2 is provided to write data into memory cells in the memory cell array 1 and read out data from the memory cells. The bit line control circuit 2 is connected to the data input-output buffer 6. Furthermore, the bit line control circuit 2 is connected to the column decoder 3 to receive a decoded address signal from the column decoder 3. The column decoder 3 receives an address signal from the address buffer 4.

The row decoder 5 is provided to control the control gates and selection gates of memory cells in the memory cell array 1. The substrate potential control circuit 7 is provided to control the potential at the well having the memory cell array 1 formed thereon.

The clock generator circuit 111 generates a clock pulse at a predetermined frequency. The clock pulse is supplied to the booster unit 112 via the regulator circuit 113. The booster unit 112 receives the clock pulse and executes booster operation. The regulator circuit 113 suppresses overshoots or ripples and exercises control so as to make it possible for the booster unit 112 to generate a stable output potential.

The booster unit 112 is connected to the bit line control circuit 2, the row decoder 5, and the substrate potential control circuit 7. Therefore, the booster unit 112 is configured so as to take charge of boosting the control gates of the memory cells via the row decoder 5 and take charge of boosting the well via the substrate potential control circuit 7.

Figure 2:
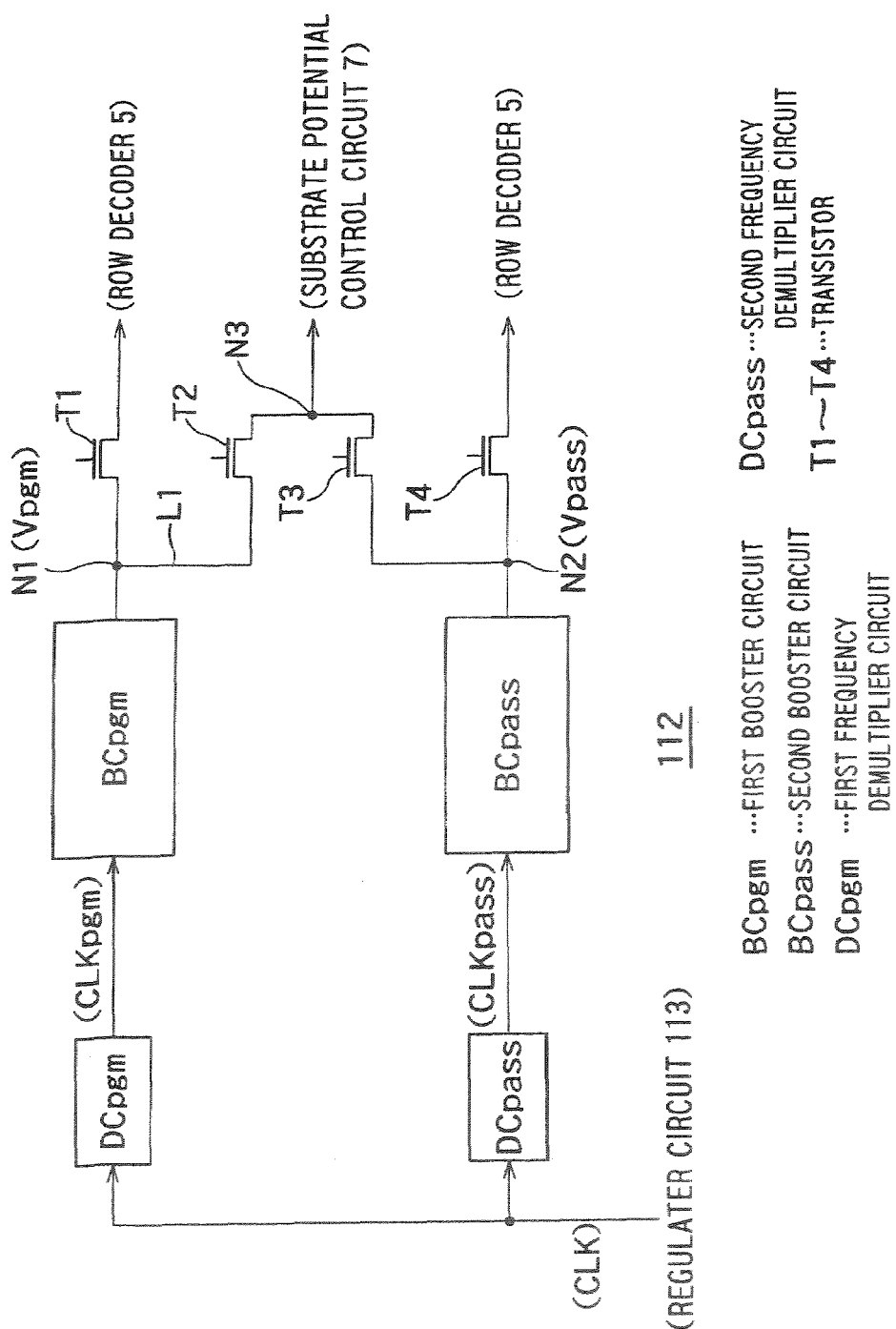
FIG. 2 is a diagram showing a partial configuration of the booster unit 112 in more detail.

FIG. 2 is a diagram showing a partial configuration of the booster unit 112 in more detail. The booster unit 112 includes a first booster circuit BCpgm and a second booster circuit BCpass. The first booster circuit BCpgm is provided to supply a voltage to control gates of selected memory cells into which data is to be written. The second booster circuit BCpass is provided to supply a voltage to control gates of inhibited memory cells into which data is not to be written. Although not illustrated in FIG. 2, the booster unit 112 includes a booster circuit which generates a readout voltage.

The first booster circuit BCpgm is configured so as to be able to boost the voltage up to a voltage (for example, a voltage in the range of 10 V to 25 V) required for the control electrodes of the selected memory cells. The second booster circuit BCpass is configured so as to be able to boost the voltage up to a voltage (for example, a voltage in the range of 5 V to 15 V) required for the control electrodes of the inhibited memory cells.

The first booster circuit BCpgm is configured so as to be able to output a higher voltage than the second booster voltage BCpass. For example, it is supposed that each of first booster circuit BCpgm and the second booster circuit BCpass has a booster stage including a capacitor and a transistor, In this case, the first booster circuit BCpgm includes more booster stages than the second booster circuit BCpass.

The booster unit 112 further includes a first frequency demultiplier circuit DCpgm connected to the first booster circuit BCpgm and a second frequency demultiplier circuit DCpass connected to the second booster circuit BCpass. The first frequency demultiplier circuit DCpgm demultiplies a frequency of the clock pulse CLK to one mth (where $m \geq 1$) for use when boosting the control electrodes of the selected memory cells. The first frequency demultiplier circuit DCpgm transmits a first clock pulse CLKpgm, which is obtained by frequency demultiplication to 1/m, to the first booster circuit BCpgm. The second frequency demultiplier circuit DCpass demultiplies a frequency of the clock pulse CLK to one nth (where $n \geq 1$) for use when boosting the control electrodes of the inhibited memory cells. The second frequency demultiplier circuit DCpass transmits a second clock pulse CLKpass, which is obtained by frequency demultiplication to 1/n, to the second booster circuit BCpass.

In the present embodiment, the clock pulse CLK is input to the first and second frequency demultiplier circuits DCpgm and DCpass in common. In data writing operation, usually m=1 and n=1are set. Therefore, the first clock pulse CLKpgm is equal in frequency to the second clock pulse CLKpass. Since the first booster circuit BCpgm has more booster stages than the second booster circuit BCpass, the first booster circuit BCpgm can output a higher voltage than the second booster circuit BCpass. On the other hand, since the second booster circuit BCpass has fewer booster stages than the first booster circuit BCpgm, the second booster circuit BCpass is better in boosting efficiency than the first booster circuit BCpgm.

Herein, the boosting efficiency is a ratio of an output charge quantity (current quantity) to power dissipation. Therefore, the second booster circuit BCpass can output more charges or more current than the first booster circuit BCpgm to the row decoder 5 or the substrate potential control circuit 7 by consuming power equal to that consumed by the first booster circuit BCpgm.

The booster unit 112 further includes transistors T1 to T4. The transistor T1 is connected between an output of the first booster circuit BCpgm and the row decoder 5. The transistor T4 is connected between an output of the second booster circuit BCpass and the row decoder 5.

The transistor T2 is connected between the output of the first booster circuit BCpgm and the substrate potential control circuit 7. The transistor T3 is connected between the output of the second booster circuit BCpass and the substrate potential control circuit 7.

In data writing operation, the transistors T1 and T4 turn on, and the transistors T2 and T3 turn off. Therefore, a potential Vpgm at an output of the first booster circuit BCpgm (a potential at a node N1) is transmitted to the row decoder 5 via the transistor T1. A potential Vpass at the second booster circuit BCpass (a potential at a node N2) is transmitted to the row decoder 5 via the transistor T4. The row decoder 5 transmits the potential Vpgm to control electrodes of memory cells via a word line.

In data erasing operation, the transistors T1 and T4 turn off, and one or both of the transistors T2 and T3 turns on. Since the transistor T2 turns on, the first booster circuit BCpgm supplies electric charge to the substrate potential control circuit 7. Since the transistor T3 turns on, the second booster circuit BCpass supplies electric charges to the substrate potential control circuit 7.

The substrate potential control circuit 7 supplies these electric charges to the well, The well has a capacitance of, for example, several nF. This is a very large capacitance as compared with the word line connected to control electrodes Therefore, it takes a long time to boost the well as compared with boosting of control gates.

Figure 3:
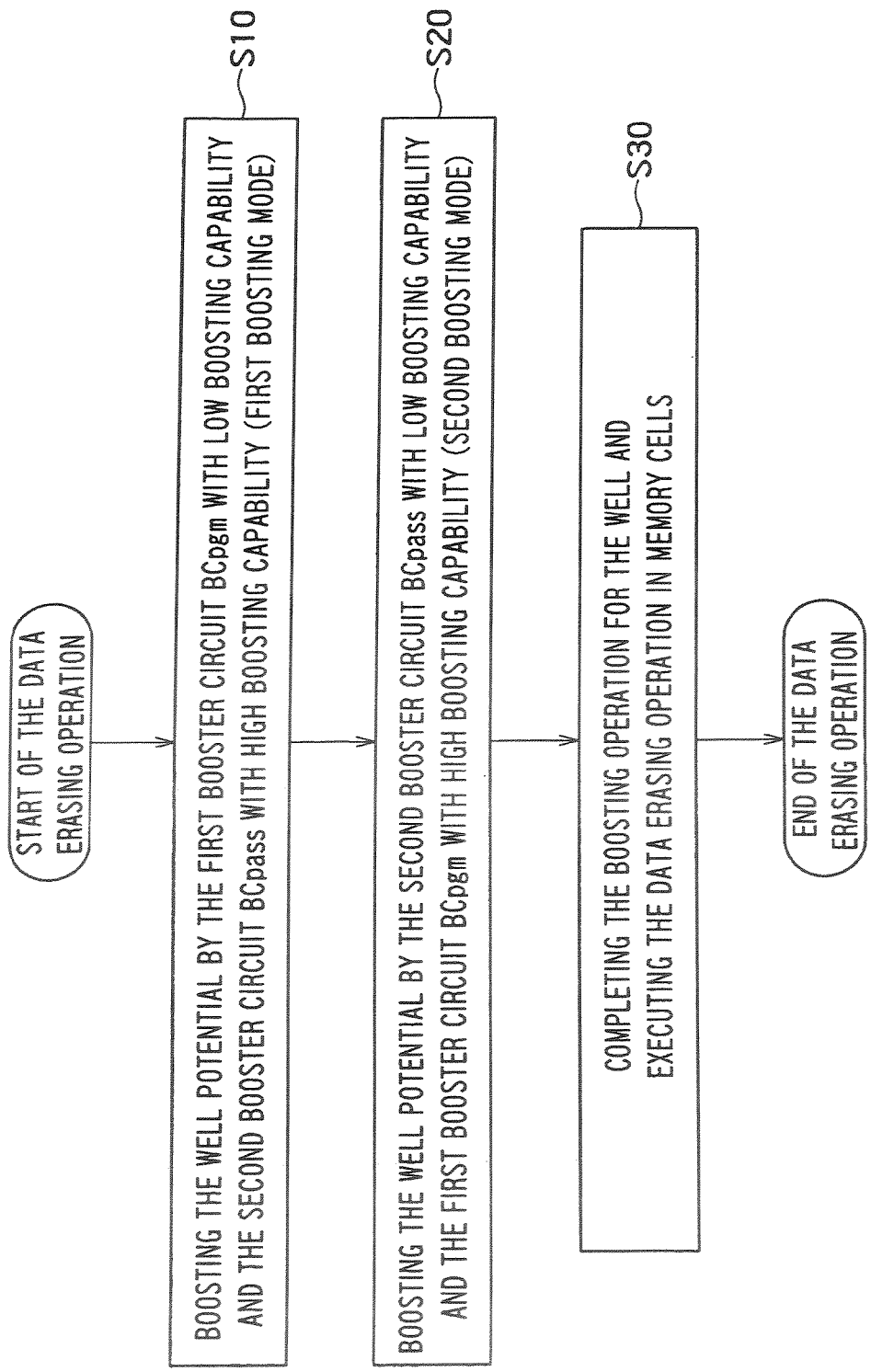
FIG. 3 is a flow diagram showing a flow of the data erasing operation.
Figure 4:
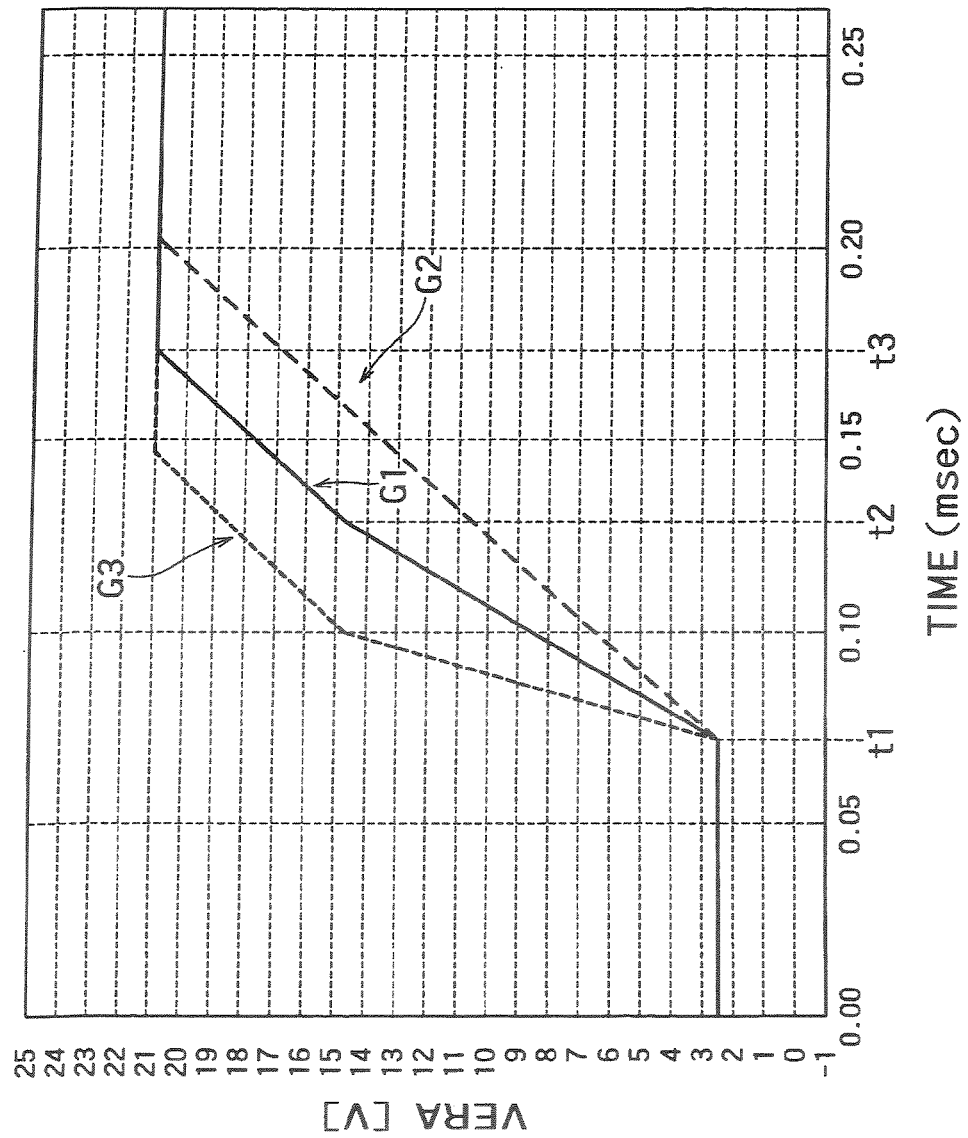
FIG. 4 is a graph showing a change of the potential at the well.
Figure 5:
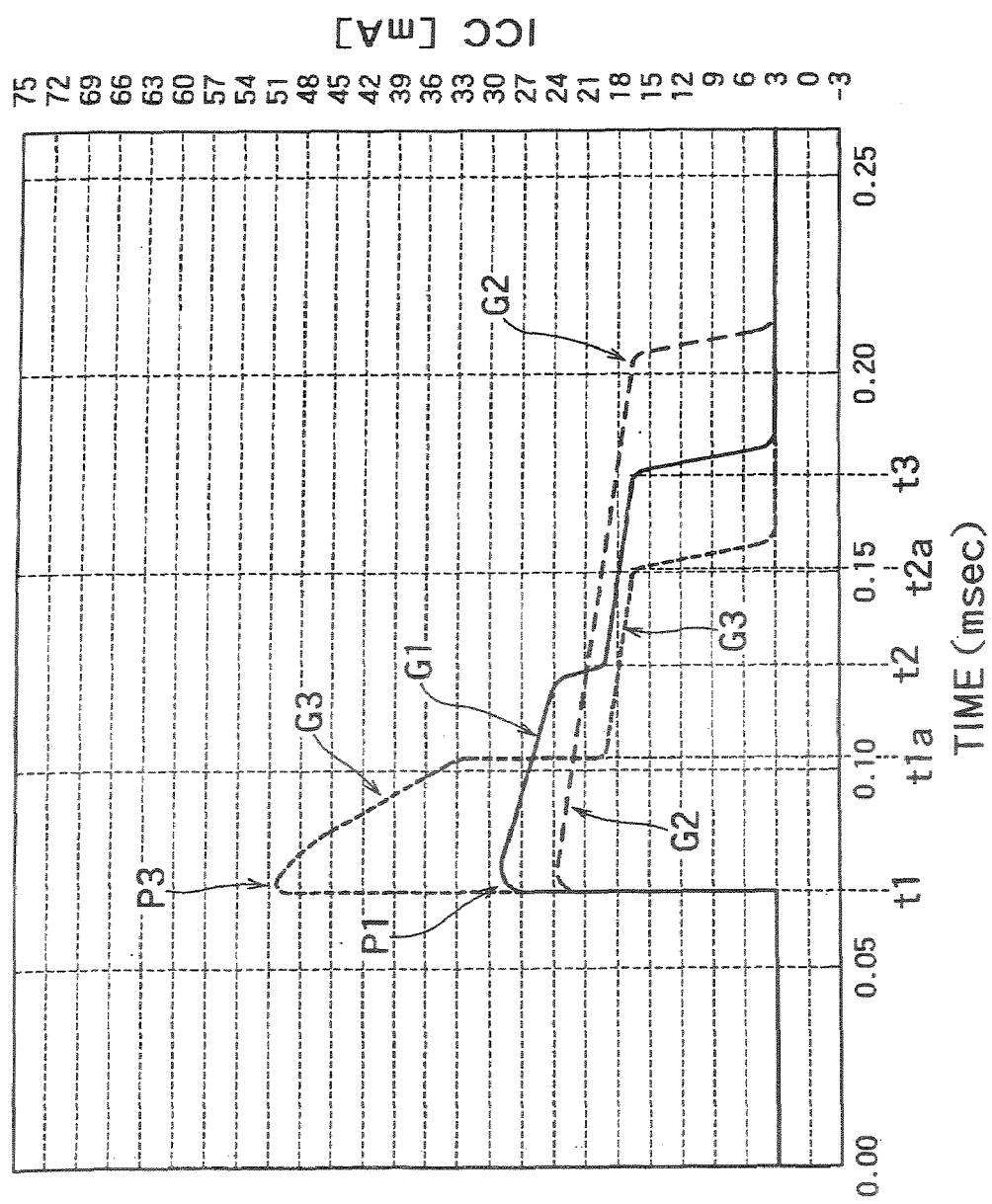
FIG. 5 is a graph showing the current dissipation of the booster unit 112.

FIG. 3 is a flow diagram showing a flow of the data erasing operation. As described above, the transistors T1 and T4 maintain the off state at the time of data erasing. FIG. 4 is a graph showing a change of the potential at the well. FIG. 5 is a graph showing the current dissipation of the booster unit 112. In FIGS. 4 and 5, a solid line graph Gi represents a result of the first embodiment, whereas a broken line graph G2 represents a result of the conventional method 1 described above and a broken line graph G3 represents a result of the conventional method 2 described above. Operation of the present embodiment will now be described with reference to FIGS. 3 to 5 Since the data writing/reading operation is not different from that in the conventional technique, its description will be omitted.

In the present embodiment, a potential up to which the first booster circuit BCpgm can boost its output potential is set to 25 V, and a potential up to which the second booster circuit BCpass can boost its output potential is set to 15 V. The well potential required to erase data is set to 21 V.

First, both the transistor T2 and the transistor T3 are turned on. As a result, the first booster circuit BCpgm and the second booster circuit BCpass are connected to the substrate potential control circuit 7 (S10, time point t1).

The second booster circuit BCpass operates with high boosting capability in the same way as at the time of the writing operation. In other words, the second frequency demultiplier circuit DCpass transmits the clock pulse CLK to the second booster circuit BCpass as the clock pulse CLKpass without conducting frequency demultiplication on it (n=1). As described above, the second booster circuit BCpass is better in boosting efficiency than the first booster circuit BCpgm. In the present embodiment (G1), therefore, the well potential can be boosted faster than the conventional method (G2) as shown in FIG. 4.

The first booster circuit BCpgm does not stop its boosting operation, and the first booster circuit BCpgm is operated in a lowered boosting capability state. This aims at boosting the well potential rapidly from a time point t2 by previously boosting the potential at an internal node in the first booster circuit BCpgm. For example, the first frequency demultiplier circuit DCpgm demultiplies the frequency of the clock pulse CLK to 1/16 (m=16), and outputs a resultant pulse as the first clock pulse CLKpgm. As a result, the first booster circuit BCpgm operates with boosting capability that is equal to 1/16 of that in the data writing operation (hereafter also referred to as idling state).

As a result, a peak (P1) of a current dissipation Icc in the whole booster unit 112 according to the present embodiment becomes smaller than a peak (P3) of a current dissipation Icc in the conventional method 2 as shown in FIG. 5. For example, the peak P3 is 51 mA, whereas the peak P1 is 28 mA. A mode in which the first booster circuit BCpgm is in the idling state and the boosting capability of the second booster circuit BCpass is high is hereafter referred to as first boosting mode. In other words, a mode with m>n is referred to as first boosting mode, Subsequently, when the well potential has reached to, for example, the vicinity of 15 V (S20, time point t2), the first booster circuit BCpgm operates with high boosting capability in the same way as the time of writing operation. In other words, in the first frequency demultiplier circuit DCpgm, the above-described m is changed from m=16 to m=1. The first frequency demultiplier circuit DCpgm transmits the clock pulse CLK to the first booster circuit BCpgm as the clock pulse CLKpgm without conducting frequency demultiplication on the clock pulse CLK.

The second booster circuit BCpass is lower in potential up to which boosting can be conducted than the first booster circuit BCpgm. If the well potential approaches the potential up to which boosting can be conducted in the second booster circuit BCpass, the boosting efficiency of the first booster circuit BCpgm exceeds the boosting efficiency of the second booster circuit BCpass. Therefore, the well can be boosted up to the erasing voltage efficiently by using the first booster circuit BCpgm instead of the second booster circuit BCpass as shown in FIG. 4.

Since only the first booster circuit BCpgm is used, an inclination of the graph G1 between time points t2 and t3 becomes equal to an inclination of the graph G2. Furthermore, the graphs G1 and G3 are switched in boosting operation at the same well potential as shown in FIG. 4. Therefore, a time interval between the time points t2 and t3 on the graph G1 is substantially equal to a time interval on the graph G3 between a time point t1a at which the boosting operation is switched and a time point t2a at which the boosting operation is stopped.

The second booster circuit BCpass stops its operation. From the time point t2 on, the boosting efficiency in the second booster circuit BCpass becomes lower than the boosting efficiency in the first booster circuit BCpgm. If the well potential further rises, it exceeds the potential up to which the second booster circuit BCpass can boost its output potential. That is the reason why the second booster circuit BCpass stops its operation. If the operation is continued even after the potential up to which the second booster circuit BCpass can boost its output potential is exceeded, not only the second booster circuit BCpass does not contribute to well boosting, but also power is dissipated wastefully.

Consequently, in the present embodiment, the peak of the current dissipation Icc in the present embodiment becomes much less. Alternatively, n may be made very large to prevent the second frequency demultiplier circuit DCpass from outputting the second clock pulse CLKpass. A mode in which the boosting capability of the first booster circuit BCpgm is thus high and the boosting capability of the second booster circuit BCpass is low is hereafter referred to as second boosting mode. In other words, a mode in which the second booster circuit BCpass is in the stop state or m<n is referred to as second boosting mode.

The time point t2 indicates a time point at which switching from the first boosting mode to the second boosting mode is conducted. The potential up to which the second booster circuit BCpass can boost its output potential is usually lower than the erasing potential required to erase the data in memory cells. Therefore, the well potential arrives at the erasing potential required to erase data in memory cells after the time point t2 of switching.

The switching from the first boosting mode to the second boosting mode may be executed when the well potential has arrived at the vicinity of the potential up to which the second booster circuit BCpass can boost its output potential. From the viewpoint of the boosting efficiency, however, it is desirable to execute the switching when the boosting efficiency of the first booster circuit BCpgm at n=1 has become equal to the boosting efficiency of the second booster circuit BCpass at m=1.

Subsequently, at time point t3, the boosting operation for the well is completed and data erasing operation in memory cells is executed (S30). The current dissipation Icc at the time of completion of the boosting operation is substantially equal in the graphs G1 to G3.

Thus, in the semiconductor storage device 10 according to the present embodiment, the second boosting circuit BCpass having a good boosting efficiency is used at the beginning of the well boosting (the first mode), and then the first booster circuit BCpgm having a high boosting potential is used (the second mode). In the semiconductor storage device 10 according to the present embodiment, therefore, data can be erased faster than the conventional method 1 and the peak of the current dissipation Icc can be lowered than the conventional method 2.

In the portable devices, an upper limit of the current dissipation Icc is determined in specifications. In addition, semiconductor storage devices having a fast operation rate are demanded. For example, it is supposed that the upper limit of the current dissipation Icc is 30 mA. A semiconductor storage device fabricated by adopting the conventional method cannot satisfy the specifications, because the boosting rate of the well is fast, but the peak of the current dissipation Icc is high. A semiconductor storage device fabricated by adopting the conventional method is low in peak of the current dissipation Icc, but slow in well boosting rate. The semiconductor storage device 10 according to the present embodiment satisfies the specifications concerning the current dissipation Icc, and has a considerably fast operation rate.

In addition, the semiconductor storage device 10 according to the present embodiment utilizes the second booster circuit BCpass equally to or more than the first booster circuit BCpgm. Since the second booster circuit BCpass having a good boosting efficiency is used when the well potential is low, the semiconductor storage device 10 according to the present embodiment is less in power dissipation than the conventional methods 1 and 2. Comparing in FIG. 5 an area S1 surrounded by the graph G1 and a line of Icc=3 mA, an area S2 surrounded by the graph G2 and the line of Icc=3 mA, and an area S3 surrounded by the graph G3 and the line of Icc=3 mA with each other, the area S1 is the smallest. This means that the power dissipation of the semiconductor storage device 10 according to the present embodiment is less than the conventional methods 1 and 2.

From the viewpoint of the power dissipation, the time point t2 of switching from the first boosting mode to the second boosting mode is desired to be a time point that minimizes the area S1.

In the embodiment, the transistor T2 is in the on-state over a time interval between the time point t1 and the time point t3. Alternatively, the transistor T2 may be in the off-state over a time interval between the time point t1 and the time point t2, and be in the on-state over a time interval between the time point t2 and the time point t3. In that case, If suitable control is not exercised, there is a fear that a potential difference between the output node N1 of the first booster circuit BCpgm and a node N3 might become large in the time interval between the time point t1 and the time point t2 and stress might be applied to the transistor T2. Furthermore, there is a fear that a snapback phenomenon might be caused by the potential difference when the transistor T2 has turned on at the time point t2.

In the above-described embodiment, the transistor T3 is remained on over the time interval between the time point t2 and the time point t3. Alternatively, the transistor T3 may be in the off-state. In that case, there is a fear that the potential difference between the output node N2 of the second booster circuit BCpass and the node N3 might become large and stress might be applied to the transistor T3.

What is claimed is:

1. A semiconductor storage device comprising:
   a semiconductor layer;
   a plurality of memory cells formed on the semiconductor layer, and data writing, erasing or reading with respect to each of the memory cells being possible based on a voltage applied to a control electrode and a voltage applied to the semiconductor layer;
   a first booster supplying a first voltage to the control electrodes when writing data in the memory cells;
   a second booster supplying a second voltage different from the first voltage to the control electrodes when writing data in the memory cells;
   a clock generator which outputs a clock signal;
   a first frequency demultiplier which demultiplies a frequency of the clock signal to one mth (where m≧1) and outputs a first demultiplied clock signal; and
   a second frequency demultiplier which demultiplies the frequency of the clock signal to one nth (where n≧1) and outputs a second demultiplied clock signal;
   wherein when erasing data in the memory cells,
      the first booster is supplied with the first demultiplied clock signal to boost a potential at a semiconductor layer,
      the second booster is supplied with the second demultiplied clock signal to boost the potential at the semiconductor layer, and
      the potential at the semiconductor layer is boosted in a first boosting mode in which m>n, and then the potential at the semiconductor layer is boosted in a second boosting mode in which m<n or the second booster is in a stop state.

2. The semiconductor storage device according to claim 1, wherein
   n=1 in the first boosting mode, and
   m=1 in the second boosting mode.

3. The semiconductor storage device according to claim 1, wherein
   the first booster does not stop its boosting operation in the first boosting mode, but the first booster waits in a state that m>1, and
   the second booster stops its boosting operation in the second boosting mode.

4. The semiconductor storage device according to claim 1, wherein
   switching from the first boosting mode to the second boosting mode is conducted before the potential of the semiconductor layer reaches to an erasing potential required for erasing data in the memory cells.

5. The semiconductor storage device according to claim 1, wherein
   switching from the first boosting mode to the second boosting mode is conducted when a charge quantity supplied from the first booster to the semiconductor layer by a certain power dissipation is equal to a charge quantity supplied from the second booster to the semiconductor layer by the certain power dissipation.

6. The semiconductor storage device according to claim 1, wherein the semiconductor storage device is a nonvolatile semiconductor storage device.

7. The semiconductor storage device according to claim 1, wherein the semiconductor storage device is a NAND flash memory.

8. The semiconductor storage device according to claim 1, wherein
the first demultiplied clock signal is supplied to the first booster when writing data in the memory cells, and
the second demultiplied clock signal is supplied to the second booster when writing data in the memory cells.

9. The semiconductor storage device according to claim 1, wherein
the first frequency demultiplier and the second frequency demultiplier demultiply different clock signals from different clock generators.

10. A driving method for a semiconductor storage device, wherein the semiconductor storage device comprises a semiconductor layer; a plurality of memory cells formed in the semiconductor layer, and data writing, erasing or reading with respect to each of the memory cells being possible based on a voltage applied to a control electrode and a voltage applied to the semiconductor layer; a first booster supplying a first voltage to the control electrodes when writing data in the memory cells; and a second booster supplying a second voltage different from the first voltage to the control electrodes when writing data in the memory cells, and when erasing data in the memory cells, the driving method comprises in a first boosting mode:
generating a first clock signal by demultiplying a frequency of a clock signal to one mth (where m≧1);
supplying the first clock signal to the first booster;
generating a second clock signal by demultiplying the frequency of the clock signal to one nth (where m>n≧1);
supplying the second clock signal to the second booster; and
boosting a potential at the semiconductor layer by inputting the first clock signal to the first booster and inputting the second clock signal to the second booster, and
the driving method comprises in a second boosting mode:
generating the first clock signal by demultiplying the frequency of the clock signal;
supplying the first clock signal to the first booster;
stopping the boosting operation of the second booster; and
boosting the potential at the semiconductor layer by inputting the first clock signal to the first booster.

11. The driving method for the semiconductor storage device according to claim 10, wherein
n=1 in the first boosting mode, and
m=1 in the second boosting mode.

12. The driving method for the semiconductor storage device according to claim 10, wherein
the first booster does not stop its boosting operation in the first boosting mode, but the first booster waits in a state that m>1.

13. The driving method for the semiconductor storage device according to claim 10, wherein
switching from the first boosting mode to the second boosting mode is conducted before the potential of the semiconductor layer reaches an erasing potential required for erasing data in the memory cells.

14. The driving method for the semiconductor storage device according to claim 10, wherein
switching from the first boosting mode to the second boosting mode is conducted when a charge quantity supplied from the first booster to the semiconductor layer by a certain power dissipation is equal to a charge quantity supplied from the second booster to the semiconductor layer by the certain power dissipation.

15. The driving method for the semiconductor storage device according to claim 10, wherein the semiconductor storage device is a nonvolatile semiconductor storage device.

16. The driving method for the semiconductor storage device according to claim 10, wherein the semiconductor storage device is a NAND flash memory.

17. The driving method for the semiconductor storage device according to claim 10, wherein
the first demultiplied clock signal is supplied to the first booster when writing data in the memory cells, and
the second demultiplied clock signal is supplied to the second booster when writing data in the memory cells.

18. The driving method for the semiconductor storage device according to claim 10, wherein
the first frequency demultiplier and the second frequency demultiplier demultiply different clock signals from different clock generators.

* * * * *